(12) United States Patent
Takagi

(10) Patent No.: US 10,903,619 B2
(45) Date of Patent: Jan. 26, 2021

(54) SEMICONDUCTOR PACKAGE

(71) Applicant: Mitsubishi Electric Corporation, Tokyo (JP)

(72) Inventor: Kazuhisa Takagi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/474,753

(22) PCT Filed: May 17, 2017

(86) PCT No.: PCT/JP2017/018567
§ 371 (c)(1),
(2) Date: Jun. 28, 2019

(87) PCT Pub. No.: WO2018/211635
PCT Pub. Date: Nov. 22, 2018

(65) Prior Publication Data
US 2020/0220322 A1    Jul. 9, 2020

(51) Int. Cl.
*H01S 5/062*     (2006.01)
*H01S 5/022*     (2006.01)
(Continued)

(52) U.S. Cl.
CPC ........ *H01S 5/02276* (2013.01); *G02B 6/4263* (2013.01); *H01L 31/173* (2013.01);
(Continued)

(58) Field of Classification Search
CPC ............. H01S 5/02212; H01S 5/02244; H01S 5/02276; H01S 5/0265; H01S 5/06251;
(Continued)

(56) References Cited

U.S. PATENT DOCUMENTS 7,109,523 B2 * 9/2006 Ishimura ............. H01S 5/02212
257/81
2003/0218923 A1 * 11/2003 Giaretta ............. H01S 5/02212
365/200

(Continued)

FOREIGN PATENT DOCUMENTS

JP    2011-108939 A    6/2011
JP    5188675 B2    4/2013

OTHER PUBLICATIONS

Takeshi Fujisawa et al., Modulator integrated light source for ultra high speed Ethernet, NTT Technical Journal, Oct. 2012, p. 53-p. 56, vol. 24, No. 10.

(Continued)

*Primary Examiner* — Tod T Van Roy
*Assistant Examiner* — Delma R Fordé
(74) *Attorney, Agent, or Firm* — Studebaker & Brackett PC

(57) ABSTRACT

A multi-wavelength integrated device (5) including plural semiconductor lasers (6) and plural modulators (7) modulating output beams of the plural semiconductor lasers (6) respectively is mounted on the stem (1). Plural leads (10) penetrates through the stem (1) and are connected to the plural semiconductor lasers (6) and the plural modulators (7) respectively. Each lead (10) is a coaxial line in which plural layers are concentrically overlapped with one another. The coaxial line includes a high frequency signal line (12) transmitting a high frequency signal to the modulator (7), a GND line (14), and a feed line (16) feeding a DC current to the semiconductor laser (6). The high frequency signal line (12) is arranged at a center of the coaxial line. The GND line (14) and the feed line (16) are arranged outside the high frequency signal line (12).

12 Claims, 4 Drawing Sheets

(51) Int. Cl.
  *H01L 31/173* (2006.01)
  *H01S 5/40* (2006.01)
  *H01S 5/0625* (2006.01)
  *G02B 6/42* (2006.01)
  *H01L 23/00* (2006.01)
  *H01B 11/18* (2006.01)

(52) U.S. Cl.
  CPC ...... *H01S 5/02212* (2013.01); *H01S 5/02244* (2013.01); *H01S 5/06253* (2013.01); *H01S 5/4087* (2013.01); *H01B 11/18* (2013.01); *H01L 24/45* (2013.01); *H01L 24/48* (2013.01); *H01L 2224/4557* (2013.01)

(58) Field of Classification Search
  CPC ..... H01S 5/06253; H01S 5/4012–4093; H01S 5/06226; H01B 9/04; H01B 11/18; H01B 11/1834; H01B 11/08–206; H01B 7/1875; H01L 24/45; H01L 24/48; H01L 2224/4557–45578; H01L 2224/48091; H01L 2224/48465; H01L 2224/48247; H01L 2224/4911; G02B 6/4263
  See application file for complete search history.

(56) References Cited

U.S. PATENT DOCUMENTS

| | | | |
|---|---|---|---|
| 2007/0085191 A1* | 4/2007 | Nobutaka | H01L 23/49811 257/691 |
| 2013/0248222 A1* | 9/2013 | Inaba | A61B 1/00114 174/107 |
| 2014/0328595 A1* | 11/2014 | Han | H01S 5/02256 398/115 |
| 2015/0116809 A1* | 4/2015 | Uto | H01S 5/02212 359/245 |
| 2017/0062096 A1* | 3/2017 | Koeppendoerfer | H01B 11/002 |

OTHER PUBLICATIONS

International Search Report; Written Opinion; and Notification of Transmittal of the International Search Report and the Written Opinion of the International Searching Authority, or the Declaration issued in PCT/JP2017/018567; dated Jul. 4, 2017.

* cited by examiner

SEMICONDUCTOR PACKAGE

FIELD

The present invention relates to a semiconductor package.

BACKGROUND

In a monolithically integrated semiconductor device, four distributed feedback type semiconductor lasers having different wavelengths and four electro-absorption type optical modulators are integrated on an n-type InP substrate. A light output from each modulator is passed through a curved waveguide, multiplexed by an MMI (Multi Mode Interferometer) multiplexer, and output from an end face of a single waveguide. Waveguide type monitor PDs are integrated behind the lasers.

By integrating plural functional devices as described above, the size can be made smaller than the size of a structure in which four existing single channel devices are arranged. In addition, the number of optical components such as an optical multiplexer can be reduced. Therefore, optical axis adjustment in a manufacturing process is simplified, so that products can be provided at low cost.

A conventional multi-wavelength integrated EML (Electro-absorption Modulated Laser diode) is mounted in a box-shaped package, and is large in size as compared with a single channel EML package (see Non-Patent Literature 1, for example). Therefore, there has been a problem that an advantage of miniaturization of a monolithic device in which multi-wavelength EMLs are integrated cannot be obtained. On the other hand, in EML for single channel, transition from the box-shape type to a CAN package type of small size has been in progress (for example, Patent Literature 1).

CITATION LIST

Patent Literature

[PTL 1] Japanese Patent No. 5188675

Non Patent Literature

[NPL 1] NTT Technical Journal 2012-10 p53

SUMMARY

Technical Problem

When multi-wavelength EML devices are mounted in a CAN package, it has been impossible to use a single lead pin for each modulator in order to supply high frequency signals to plural EMLs under a low-crosstalk state. In order to supply DC voltage/current to plural EMLs, in addition to present three lead wires for an LD current source, a voltage source to monitor PDs, and a current source for a Peltier device, lead pins whose number corresponds to the number of devices to be integrated have been required for LD current sources and voltage sources to the monitor PDs. Accordingly, the size of the CAN package has increased due to increase in number of the lead pins, which has caused a problem that miniaturization is difficult.

The present invention has been made to solve the problem as described above, and has an object to provide a semiconductor package capable of supplying plural modulators with high frequency signals under a low-crosstalk state and suppressing an increase in number of lead pins.

Solution to Problem

A semiconductor package according to the present invention includes, a stem, a multi-wavelength integrated device mounted on the stem and including plural semiconductor lasers and plural modulators modulating output beams of the plural semiconductor lasers respectively; and plural leads penetrating through the stem and connected to the plural semiconductor lasers and the plural modulators respectively, wherein each lead is a coaxial line in which plural layers are concentrically overlapped with one another, the coaxial line includes a high frequency signal line transmitting a high frequency signal to the modulator, a GND line, and a feed line feeding a DC current to the semiconductor laser, the high frequency signal line is arranged at a center of the coaxial line, and the GND line and the feed line are arranged outside the high frequency signal line.

Advantageous Effects of Invention

In the present invention, each lead is a coaxial line in which plural layers are concentrically overlapped with one another. As a result, it is unnecessary to provide an individual lead pin for each of the signal line, the GND line and the feed so that it is possible to suppress the number of lead pins from increasing. Further, the high frequency signal line is arranged at the center of the coaxial line, and the GND line is arranged outside the high frequency signal line. As a result, the high frequency signal line is shielded by the GND line, so that high frequency signals can be supplied to the plural modulators under a small-crosstalk state.

DESCRIPTION OF EMBODIMENTS

A semiconductor package according to the embodiments of the present invention will be described with reference to the drawings. The same components will be denoted by the same symbols, and the repeated description thereof may be omitted.

First Embodiment

Figure 1:
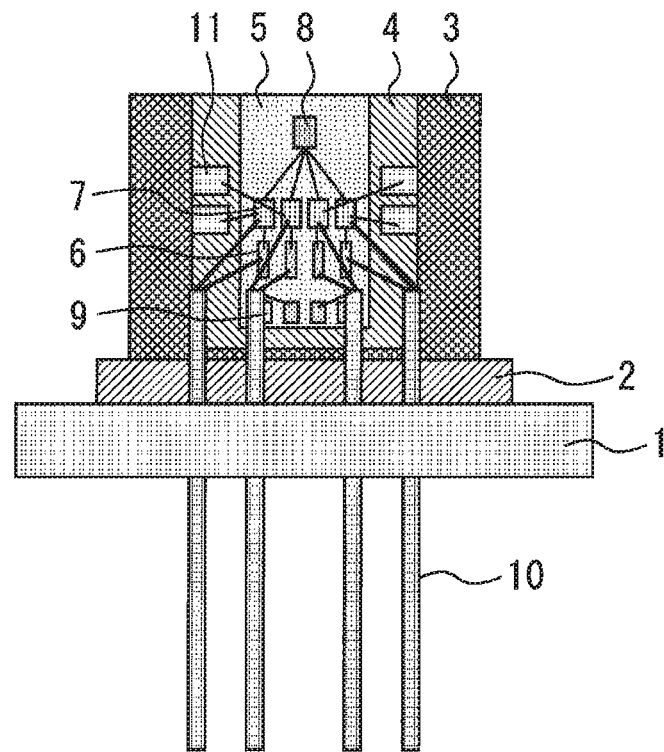
FIG. 1 is a side view showing a semiconductor package according to a first embodiment of the present invention.

FIG. 1 is a side view showing a semiconductor package according to a first embodiment of the present invention.

Figure 2:
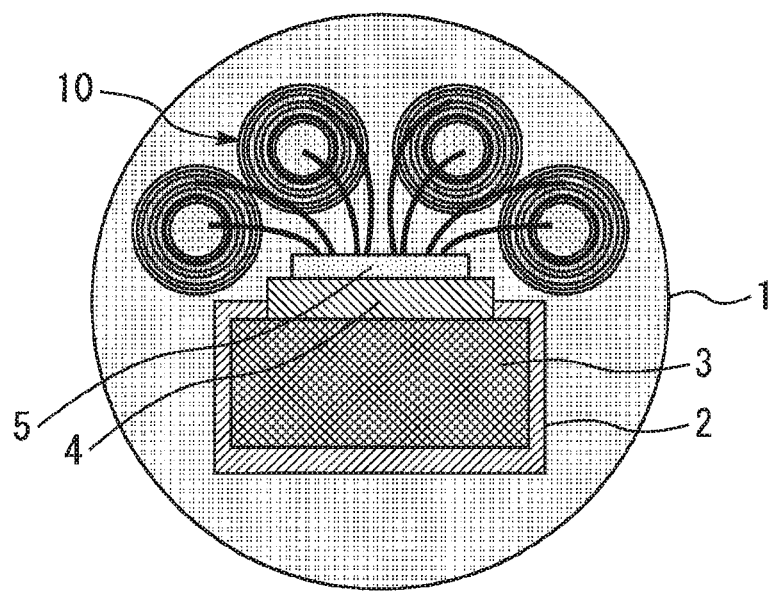
FIG. 2 is a top view showing the semiconductor package according to the first embodiment of the present invention.

FIG. 2 is a top view showing the semiconductor package according to the first embodiment of the present invention. The semiconductor package is a TO-CAN package in which multi-wavelength integrated EMLs used for a light source for CWDM transmission of 100 Gb/s or the like are mounted.

A Peltier device 2 is provided on a stem main body 1 of a circular flat plate. A sub-mount mounting portion 3 is provided on the Peltier device 2. A sub-mount 4 is mounted on the sub-mount mounting portion 3.

A multi-wavelength integrated device 5 is mounted on the sub-mount 4. The Peltier device 2 controls the temperature of the multi-wavelength integrated device 5. The multi-wavelength integrated device 5 includes four semiconductor lasers 6, four modulators 7 for modulating output beams of the four semiconductor lasers 6 respectively, a multiplexer 8 for multiplexing the output beams of the four modulators 7, and four monitor photodiodes 9 for monitoring the four semiconductor lasers 6, respectively. Four leads 10 penetrate through the stem main body 1, and are connected to the four semiconductor lasers 6, the modulators 7 and the monitor photodiodes 9 respectively by wires. Terminating resistors 11 are connected to the modulators 7.

Figure 3:
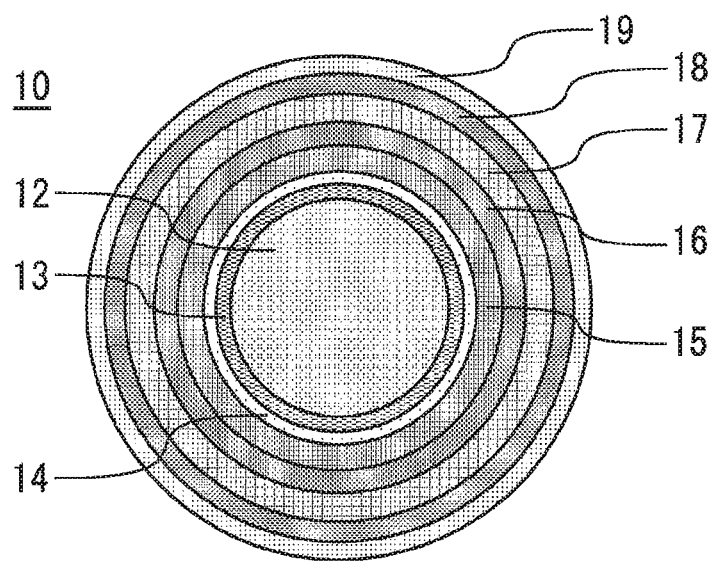
FIG. 3 is a cross-sectional view showing a lead according to the first embodiment of the present invention.
Figure 4:
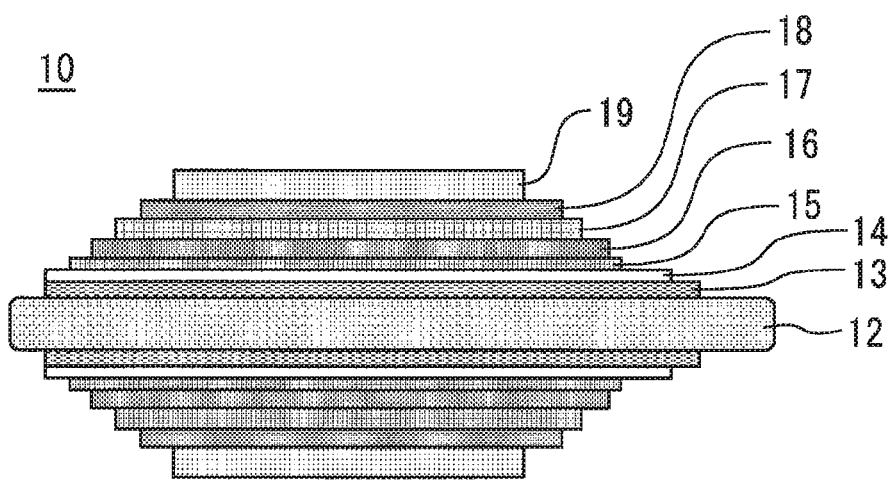
FIG. 4 is a longitudinally sectional view showing the lead according to the first embodiment of the present invention.

FIG. 3 is a cross-sectional view showing a lead according to the first embodiment of the present invention. FIG. 4 is a longitudinally sectional view showing the lead according to the first embodiment of the present invention. Each lead 10 is a coaxial line in which plural layers are concentrically overlapped with one another. The coaxial line includes a high frequency signal line 12, an insulator 13, a GND line 14, an insulator 15, a feed line 16, an insulator 17, a feed line 18, and an insulator 19 which are successively arranged in this order from the center to the outside.

The high frequency signal line 12 transmits a high frequency signal to the modulator 7. The feed line 16 feeds a DC current to the semiconductor laser 6. The feed line 18 feeds a DC current to the monitor photodiode 9. The high frequency signal line 12 is arranged at the center of the coaxial line. The GND line 14 and the feed lines 16 and 18 are arranged outside the high frequency signal line 12. The GND line 14 and the feed lines 16, 18 of DC are arranged in random order.

In order to set the impedance of the coaxial line to a desired value, it is necessary to properly select the dielectric constant of the insulator 13, but no limitation is imposed on the dielectric constants of the insulators 15, 17 and 19. However, in order to prevent high frequency signals from being superimposed on the GND line 14 and the feed lines 16, 18 of DC, it is preferable that the insulators 15, 17, 19 have high dielectric constants.

For example, it is necessary to design the values of the diameter d of the high frequency signal line 12, the outer diameter D of the insulator 13, and the relative dielectric constant ε so that the impedance of the high frequency signal line 12 is equal to 50Ω. The impedance Z of the coaxial line is approximately expressed by $Z=138/\text{Root}(\varepsilon)*\log 10(D/d)$. For example, assuming that d is equal to 100 μm and D is equal to 500 μm, the relative dielectric constant of the insulator 13 is required to be equal to 3.7. In this case, $SiO_2$ having a relative dielectric constant of 3.9, alumina having a relative dielectric constant of 3.8, or the like is used as the insulator 13. The values of d, D, and ε and selection of the material of the insulator 13 are design matters, and do not limit the scope of the present invention.

As described above, in the present embodiment, each lead 10 is a coaxial line in which plural layers are concentrically overlapped with one another. As a result, it is unnecessary to provide an individual lead pin for each of the signal line, the GND line and the feed line, so that it is possible to suppress the number of lead pins from increasing. Further, the high frequency signal line 12 is arranged at the center of the coaxial line, and the GND line 14 is arranged outside the high frequency signal line 12. As a result, the high frequency signal line 12 is shielded by the GND line 14, so that high frequency signals can be supplied to the plural modulators 7 under a small-crosstalk state.

The insulators 13, 15, 17 which insulate the high frequency signal line 12, the GND line 14, and the feed lines 16, 18 from one another are plastic materials such as polyethylene, whereby handling such as bending is easy for each lead 10. Moreover, the insulator 19 of a portion of the coaxial line which is joined to the stem main body 1 is insulating glass, which does not cause any problem in airtightness when CAN is connected to the stem main body 1.

The conductors other than the high frequency signal line 12 of the coaxial line may be spirally wound metal plates having a width of 1 mm or less. As a result, the flexibility of the coaxial lead is enhanced, and handling such as bending is facilitated.

Second Embodiment

Figure 5:
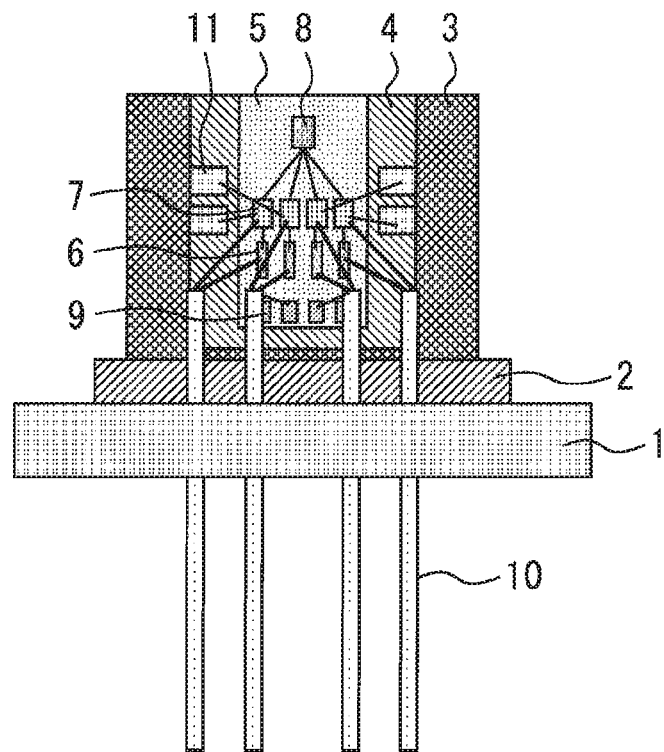
FIG. 5 is a side view showing a semiconductor package according to a second embodiment of the present invention.
Figure 6:
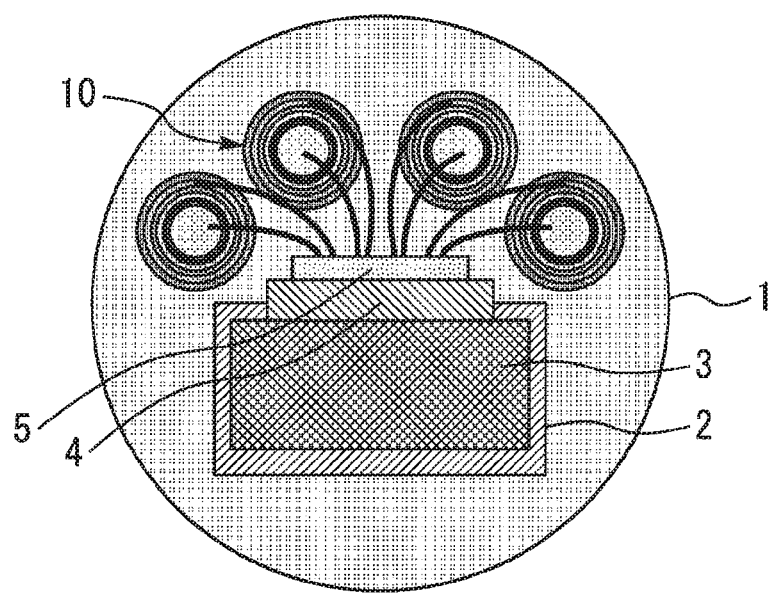
FIG. 6 is a top view showing the semiconductor package according to the second embodiment of the present invention.
Figure 7:
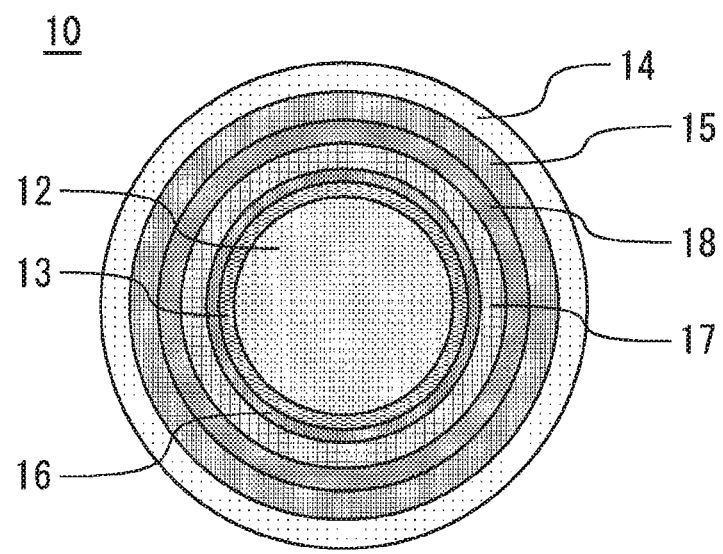
FIG. 7 is a cross-sectional view showing a lead according to the second embodiment of the present invention.
Figure 8:
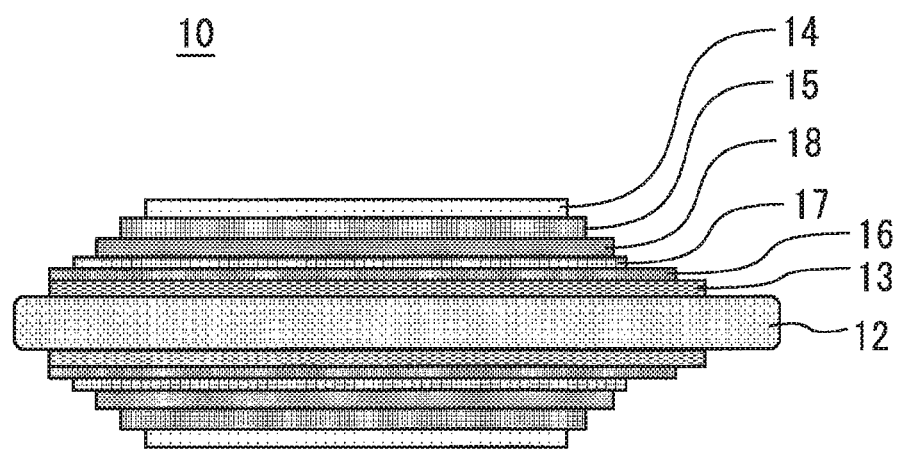
FIG. 8 is a longitudinally sectional view showing the lead according to the second embodiment of the present invention.

FIG. 5 is a side view showing a semiconductor package according to a second embodiment of the present invention. FIG. 6 is a top view showing the semiconductor package according to the second embodiment of the present invention. FIG. 7 is a cross-sectional view showing a lead according to the second embodiment of the present invention. FIG. 8 is a longitudinally sectional view showing the lead according to the second embodiment of the present invention.

The coaxial line of each lead 10 includes a high frequency signal line 12, an insulator 13, a feed line 16, an insulator 17, a feed line 18, an insulator 15, and a GND line 14 which are successively arranged in this order from the center to the outside. The other configuration is similar to that of the first embodiment, and the same effect as the first embodiment can be obtained. The feed lines 16, 18 of DC are arranged in random order.

In the present embodiment, the GND line 14 is arranged on the outermost periphery of the coaxial line. Since the stem main body 1 is also GND, it is unnecessary to interpose an insulating film between the lead 10 and the stem main body 1, and the airtightness of the CAN package is enhanced.

Note that although EML devices of four wavelengths are integrated in the first and second embodiments, two or more EML devices may be integrated, the same effect as the first and second embodiments can be obtained regardless of the number of devices to be integrated.

REFERENCE SIGNS LIST 1 stem; 5 multi-wavelength integrated device; 6 semiconductor laser; 7 modulator; 9 monitor photodiode; 10 lead; 12 high frequency signal line; 13,15,17,19 insulator; 14 CND line; 16,18 feed line.

The invention claimed is:
1. A semiconductor package comprising:
a stem;
a multi-wavelength integrated device mounted on the stem and including plural semiconductor lasers and plural modulators modulating output beams of the plural semiconductor lasers respectively; and plural leads penetrating through the stem and connected to the plural semiconductor lasers and the plural modulators respectively, wherein each lead is a coaxial line in which plural layers are concentrically overlapped with one another, each coaxial line includes a high frequency signal line transmitting a high frequency signal to one of the modulators, a GND line, and a feed line feeding a DC current to one of the semiconductor lasers, the high frequency signal line is arranged at a center of each coaxial line, and the GND line and the feed line are arranged outside the high frequency signal line.

2. The semiconductor package according to claim 1, wherein each coaxial line includes a plastic material insulating the high frequency signal line, the GND line, and the feed line from one another, and insulating glass joined to the stem.

3. The semiconductor package according to claim 1, wherein the GND line is arranged on an outermost periphery of each coaxial line.

4. The semiconductor package according to claim 1, further comprising monitor photodiodes for monitoring the semiconductor lasers, wherein each coaxial line includes a second feed line arranged outside the high frequency signal line and feeding a DC current to each respective monitor photodiode.

5. The semiconductor package according to claim 1, wherein a conductor other than the high frequency signal line of each coaxial line is a spirally wound metal plate.

6. The semiconductor package according to claim 2, further comprising monitor photodiodes for monitoring the semiconductor lasers, wherein each coaxial line includes a second feed line arranged outside the high frequency signal line and feeding a DC current to each respective monitor photodiode.

7. The semiconductor package according to claim 3, further comprising monitor photodiodes for monitoring the semiconductor lasers, wherein each coaxial line includes a second feed line arranged outside the high frequency signal line and feeding a DC current to each respective monitor photodiode.

8. The semiconductor package according to claim 2, wherein a conductor other than the high frequency signal line of each coaxial line is a spirally wound metal plate.

9. The semiconductor package according to claim 3, wherein a conductor other than the high frequency signal line of each coaxial line is a spirally wound metal plate.

10. The semiconductor package according to claim 4, wherein a conductor other than the high frequency signal line of each coaxial line is a spirally wound metal plate.

11. The semiconductor package according to claim 6, wherein a conductor other than the high frequency signal line of each coaxial line is a spirally wound metal plate.

12. The semiconductor package according to claim 7, wherein a conductor other than the high frequency signal line of each coaxial line is a spirally wound metal plate.

* * * * *